United States Patent
Domingues Dos Santos et al.

(10) Patent No.: US 12,167,698 B2
(45) Date of Patent: *Dec. 10, 2024

(54) FORMULATIONS BASED ON ELECTROACTIVE FLUOROPOLYMERS FOR ACTUATORS

(71) Applicant: ARKEMA FRANCE, Colombes (FR)

(72) Inventors: Fabrice Domingues Dos Santos, Paris (FR); Seung Tae Choi, Seoul (KR); Hung Viet Tran, Ho Chi Minh (VN)

(73) Assignee: ARKEMA FRANCE, Colombes (FR)

( * ) Notice: Subject to any disclaimer, the term of this patent is extended or adjusted under 35 U.S.C. 154(b) by 731 days.

This patent is subject to a terminal disclaimer.

(21) Appl. No.: 16/637,311

(22) PCT Filed: Jul. 19, 2018

(86) PCT No.: PCT/EP2018/069677
§ 371 (c)(1),
(2) Date: Feb. 7, 2020

(87) PCT Pub. No.: WO2019/029975
PCT Pub. Date: Feb. 14, 2019

(65) Prior Publication Data
US 2020/0235283 A1    Jul. 23, 2020

(30) Foreign Application Priority Data
Aug. 9, 2017 (FR) ..................... 1757603

(51) Int. Cl.
*H10N 30/85* (2023.01)
*C08J 5/18* (2006.01)
(Continued)

(52) U.S. Cl.
CPC .............. *H10N 30/857* (2023.02); *C08J 5/18* (2013.01); *C08L 27/16* (2013.01); *H10N 30/077* (2023.02);
(Continued)

(58) Field of Classification Search
None
See application file for complete search history.

(56) References Cited

U.S. PATENT DOCUMENTS 4,554,335 A * 11/1985 Sakagami ................ H01G 4/18
428/917
4,708,989 A    11/1987 Broussoux et al.
(Continued)

FOREIGN PATENT DOCUMENTS

CN    103387682 A    11/2013
CN    103951917 A    7/2014
(Continued)

OTHER PUBLICATIONS

English abstract of CN 103187466 A , Jul. 3, 2013, China.*
(Continued)

*Primary Examiner* — Tae H Yoon
(74) *Attorney, Agent, or Firm* — Boone IP Law

(57) ABSTRACT

The present invention relates to compositions obtained by mixing specific electroactive fluoro-terpolymers and specific electroactive fluorinated copolymers. The invention also concerns liquid formulations (inks) that can be used through conventional processing technologies for printed electronics and microelectronics in a safe environment, based on these compositions. Another aspect of this invention are the films manufactured using these formulations, and the devices comprising at least one layer of these films.

15 Claims, 1 Drawing Sheet

(51) Int. Cl.
*C08L 27/16* (2006.01)
*H10N 30/07* (2023.01)
*H10N 30/077* (2023.01)
*H10N 30/20* (2023.01)
*H10N 30/857* (2023.01)

(52) U.S. Cl.
CPC ...... *H10N 30/2042* (2023.02); *C08J 2327/16* (2013.01); *C08J 2427/16* (2013.01); *C08L 2201/56* (2013.01); *C08L 2203/20* (2013.01); *C08L 2205/025* (2013.01)

(56) References Cited

U.S. PATENT DOCUMENTS

| | | | | |
|---|---|---|---|---|
| 5,087,679 | A | * | 2/1992 | Inukai .................. H01B 3/443 428/917 |
| 11,871,650 | B2 | * | 1/2024 | Domingues Dos Santos .............. H10K 85/151 |
| 2015/0307673 | A1 | | 10/2015 | Domingues Dos Santos et al. |
| 2015/0325228 | A1 | * | 11/2015 | Choi .................. H01L 41/083 156/306.6 |
| 2016/0087185 | A1 | | 3/2016 | Cheng |
| 2016/0284714 | A1 | | 9/2016 | Park et al. |
| 2017/0192354 | A1 | | 7/2017 | Zhao et al. |
| 2018/0163041 | A1 | * | 6/2018 | Abgrall ................ B32B 27/304 |
| 2021/0376239 | A1 | | 12/2021 | Domingues Dos Santos et al. |

FOREIGN PATENT DOCUMENTS

| | | |
|---|---|---|
| EP | 0206926 A1 | 12/1986 |
| JP | S62-01744 A | 1/1987 |
| KR | 20170034435 A | 3/2017 |
| TW | 201606436 A | 2/2016 |
| WO | 2010116105 A1 | 10/2010 |
| WO | 2011008940 A1 | 1/2011 |
| WO | 2014091130 A1 | 6/2014 |
| WO | 2016039830 A1 | 3/2016 |
| WO | 2016055712 A1 | 4/2016 |
| WO | 2017093145 A1 | 6/2017 |

OTHER PUBLICATIONS

Search Report issued on Apr. 11, 2022, by the Taiwan Intellectual Property Office in corresponding Taiwanese Patent Application No. 107127632, (2 pages).

Jung, S., et al."Low-voltage-operated top-gate polymer thin-film transistors with high-capacitance P(VDF-TrFE)/PVDF-blended dielectrics" Journal of Applied Physics, vol. 11, No. 3 , Jan. 22, 2011, pp. S213-S218.

Office Action (The First Office Action) issued on Aug. 27, 2021, by the State Intellectual Property Office (SIPO) of the People's Republic of China in corresponding Chinese Patent Application No. 201880052017.8 and an English Translation of the Office Action. (12 pages).

Xia, Feng, et. al."High Electromechanical Responses in a Poly(vinylidene fluoride-trifluoroethylene-chlorofluoroethylene) Terpolymer", Advanced Materials, vol. 14, issue 21, pp. 1574-1577., 2002.

Casar, G. et al."Influencing dielectric properties of relaxor polymer system by blending vinylidene fluoride-trifluoroethylene-based terpolymer with a ferroelectric copolymer", Journal of Applied Physics, pp. 104101-1 to 104101-5, 2014.

Chen, et al., "Enhanced electrocaloric effect in poly(vinylidene fluoride-trifluoroethylene)-based terpolymer/copolymer blends", App li ed Physics Letters, May 2012, vol. 100, No. 22, pp. 222902-1 to 222902-4.

Chu, et al., "Energy storage properties of PVDF terpolymer/PMMA blends", High Voltage, Dec. 2016, vol. 1, No. 4, pp. 171-174.

International Search Report (PCT/ISA/210) and Written Opinion (PCT/ISA/237) mailed on Sep. 12, 2018, by the European Patent Office as the International Searching Authority for International Application No. PCT/EP2018/069677.

Ju, et al., "A flexible tactile-feedback touch screen using transparent ferroelectric polymer film vibrators", Smart Materials and Structures, 2014, 23(7), 074004, 10 pages.

Jung, et al., "Low-voltage-operated top-gate polymer thin-film transistors with high-capacitance P(VDF-TrFE)/PVDF-blended dielectrics", Current Applied Physics, Jan. 2011, vol. 11, No. 3, pp. S213-S218.

Merle, "Mechanical properties of thin films studied by bulge testing", Erlanger, Fau University Press, 2013, pp. 1-148.

Zhu, et al., "Size effects on elasticity, yielding and fracture of silver nanowires: in situ experiments", Physical Review B 85, pp. 045443-1 to 045443-7, 2012.

Ullah, et al."Enhancement of Dielectric and Energy Density Properties in the PVDF-Based Copolymer/Terpolymer Blends" Polymer Engieering and Science, (Apr. 7, 2015), vol. 55, No. 6, pp. 1396-1402.

Office Action issued on Mar. 16, 2021, by the European Patent Office in corresponding European Patent Application No. 18 762 380.6-1107, (6 pages).

Office Action (Notice of Rejection) issued Jun. 14, 2022, by the Japanese Patent Office in corresponding Japanese Patent Application No. 2020-507048, with English translation. (14 pages).

Office Action issued on Jan. 20, 2023, by the Intellectual Property Office in corresponding Korean Patent Application No. 10-2020-7006370, With English Translation. (7 pages).

* cited by examiner

FORMULATIONS BASED ON ELECTROACTIVE FLUOROPOLYMERS FOR ACTUATORS

CROSS REFERENCE TO RELATED APPLICATIONS

The present application is a U.S. national stage of International Application No. PCT/EP2018/069677, filed on Jul. 19, 2018, which claims the benefit of French Application No. 1757603, filed on Aug. 9, 2017.

FIELD OF THE INVENTION

The present invention relates to compositions obtained by mixing specific electroactive fluoro-terpolymers and specific electroactive fluorinated copolymers. The invention also concerns liquid formulations (inks) that can be used through conventional processing technologies for printed electronics and microelectronics in a safe environment, based on these compositions. Another aspect of this invention are the films manufactured using these formulations, and the devices comprising at least one layer of these films.

TECHNICAL BACKGROUND

Fluoropolymers represent a class of compounds having noteworthy properties for a large number of applications, from painting or special coatings to sealing joints, via optics, microelectronics and membrane technology. Among these fluoropolymers, copolymers are particularly advantageous due to their diversity, their morphology, their exceptional properties and their versatility.

Some fluorinated polymers such as Poly(vinylidene-fluoride) and its derivatives such as poly(vinylidenefluoride-co-trifluoroethylene) (P(VDF-TrFE)), Poly(vinylidenefluoride-co-tetrafluoroethylene) (P(VDF-TFE)), Poly(vinylidene fluoride-co-trifluoroethylene-co-chlorofluoroethylene) (P(VDF-TrFE-CFE), Poly(vinylidene fluoride-co-trifluoroethylene-co-chlorotrifluoroethylene) (P(VDF-TrFE-CTFE) exhibit specific electroactive properties. These polymers belong to the class of ferroelectric or relaxor ferroelectric materials. After an appropriate processing in a film form, these materials exhibit a large polarization versus electric field hysteresis behavior characterized by a remnant polarization and a coercive field. Once poled, films made from PVDF or some P(VDF-TrFE) and P(VDF-TFE) copolymers may then exhibit piezoelectric properties. They will deform under an applied voltage with limited deformation (typically 0.5%) and generate a voltage when subjected to a mechanical stress or deformation.

In order to have ferroelectric properties, fluorinated polymer materials have to be in a ferroelectric polar crystalline phase. PVDF films need to be processed in specific conditions, for example to be stretched to get ferroelectric crystalline structures. P(VDF-TrFE) copolymers, with TrFE content in the range of 18 to 50 mol %, crystalize directly in the ferroelectric or relaxor ferroelectric phase from solutions. They can then be processed through solvent based technologies (ink-jet, slot-die, spin-coating, screen-printing, etc). As ferroelectric materials, they exhibit polarization-electric field hysteresis behavior. After appropriate processing, the application of an electric field above the coercive field, films based on these polymers exhibit piezoelectric and pyroelectric properties. They find applications in sensors, actuators, energy harvesting or printed memories. Increasing VDF content in copolymer enable to higher Curie temperature transition. Above this temperature, devices based on P(VDF-TrFE) copolymers lose their ferroelectric, piezoelectric and pyroelectric properties. Regarding actuator applications, thanks to their piezoelectric properties, films and devices based on these copolymers can be deformed under moderated applied electric voltage. These copolymers have high elastic modulus (above 1 GPa); however, deformation under applied electrical field remains low (typically 0.5%).

Electroactive fluoroterpolymers, generally used in the form of films, of deposits or of stacks, combined with electrodes, have noteworthy electromechanical properties. They have a high electromechanical energy density. Thus, when devices comprising such terpolymers are subjected to an electric field, they become strained, which makes possible the production of actuators. P(VDF-TrFE-CFE) or P(VDF-TrFE-CTFE) are relaxor ferroelectric terpolymers. Films based on these terpolymers exhibit a thin polarization-electric field hysteresis and high dielectric constant that depend on temperature and frequency. They exhibit also electrostrictive properties (deformation proportional to the square of the applied electric field) with larger deformation under applied electric field compared to ferroelectric copolymers. Some examples of developing applications of these materials are dielectric for transistors, capacitors, electrocaloric devices and actuators. In actuator applications (haptics, microfluidic, ultrasound transducers, loudspeakers, etc.) these terpolymers exhibit larger maximum deformation under applied electric field than the copolymers, but they usually need larger driving voltage. They also exhibit a lower young modulus than the copolymers.

The document WO 2011/008940 describes polymer blends comprising at least one electrostrictive terpolymer, e.g., P(VDF-TrFE-CFE) or a derivative thereof, and at least one fluoropolymer, e.g., PVDF or derivative thereof such as P(VDF-TrFE). Such blends are intended to improve the modulus of terpolymers, without adversely affecting the electromechanical properties. FIG. 6 compares the elastic modulus of uniaxially stretched blend films as a function of temperature for blends of P(VDF-TrFE-CFE) terpolymer (70/30/8 mol %) with P(VDF-CTFE) copolymer (91/9 mol %) at various weight percentages (wt %) of P(VDF-CTFE) to the total weight of the blend, and neat films of the P(VDF-TrFE-CFE) and P(VDF-CTFE). The elastic modulus Y of the blends is increased as the P(VDF-CTFE) weight % increases. However electromechanical properties of the blend, such as elastic energy density generated by an applied voltage measured at room temperature, show a decrease when compared to the terpolymer alone.

The document EP 0206926 describes blends of ferroelectric polymers, such as P(VDF-TrFE) copolymers and P(VDF-TrFE-CTFE) or P(VDF-TrFE-HFP) terpolymers, with different Curie temperatures. These blends display high relative dielectric permittivity over a wide range of temperatures and frequencies. For example, a blend of a P(VDF-TrFE-CTFE) terpolymer containing 10 mol % of CTFE, with a P(VDF-TrFE) copolymer (60-40 mol %), (Blend I, corresponding to curve 18 in FIG. 7), provides a dielectric permittivity between 20 and 30 in the 20-100° C. temperature range, with a maximum at 80° C. The electromechanical properties of these blends are not described.

There thus exists a need to provide new polymer materials which exhibit good electromechanical properties (in particular for use in actuators), while having good mechanical properties, such as elastic modulus, over a wide range of temperatures and frequencies associated with applications such as automotive or consumer electronics.

SUMMARY OF THE INVENTION

According to a first aspect, the invention concerns an electroactive fluoropolymer composition consisting of:
a) an electroactive terpolymer of formula P(VDF-TrFE-X) comprising monomer units of vinylidene fluoride, of trifluoroethylene and of a third monomer X, X being 1-chloro-1-fluoroethylene (CFE) or chlorotrifluoroethylene (CTFE), the molar proportion of X units in the terpolymer being inferior to 8%, preferably inferior or equal to 7% and more preferably inferior or equal to 5%, and
b) an electroactive copolymer of formula P(VDF-TrFE) comprising monomer units of vinylidene fluoride and of trifluoroethylene.

The molar proportion of TrFE units in the copolymer is superior to 40%, preferably superior or equal to 45%. Advantageously, the P(VDF-TrFE) copolymer when processed as a film is not irradiated and not modified by stretching.

According to one embodiment, the electroactive fluoro-terpolymer is a terpolymer of vinylidene fluoride, of trifluoroethylene and of 1-chloro-1-fluoroethylene.

According to one embodiment, the electroactive fluoro-terpolymer is a terpolymer of vinylidene fluoride, of trifluoroethylene and of chlorotrifluoroethylene.

According to one embodiment, the molar ratio VDF/(VDF+TrFE) is in the range of 15 to 60%, preferably in the range of 30 to 55%.

The invention also relates to a liquid formulation (or ink) of electroactive fluoropolymers comprising the composition described above in a solvent.

The invention also relates to a polymer film manufactured from the formulation of electroactive fluoropolymers through technologies such as solvent casting, spin-coating, slot-dye, gravure, inkjet, etc. Advantageously, the film according to the invention is not stretched after being manufactured, and is employed in an un-stretched state for the making of different electronic devices.

The invention also relates to a device comprising at least one layer of the film described above. Such devices are chosen among actuators, electromechanic devices, acoustic devices (loudspeakers, ultrasound transducers), microelectromechanic systems, optoelectronics devices, sensors or electrocaloric devices.

According to one embodiment, the device additionally comprises electrodes on either side of the film, said device preferably being an actuator.

According to one embodiment, the manufacturing process comprises an additional stage of deposition of electrodes, preferably by evaporation or sputtering of metal, indium tin oxide, a layer of conductive polymer, conductive ink based on silver, silver nanowires, copper or graphene.

The present invention makes it possible to overcome the disadvantages of the state of the art. It more particularly provides a composition which exhibits good electromechanical properties (in particular for use in actuators), and good mechanical properties in a wide range of temperatures, from −20 to 130° C., especially from 25 to 60° C., and a wide range of frequencies (from 0 to 1 MHz and preferably from 0 to 20 kHz). The addition of appropriate P(VDF-TrFE) copolymer to a P(VDF-TrFE-CFE) or a P(VDF-TrFE-CTFE) terpolymer results in improved electromechanical energy of the terpolymer.

This is accomplished by virtue of the combination between an electroactive fluoro-terpolymer and an electroactive copolymer compatible with the terpolymer.

The present inventors have discovered that this combination makes it possible to obtain devices having electromechanical properties which are considerably improved (greater generated electromechanical energy extended over a broad temperature range) with respect to those of the terpolymer alone. The mechanical properties (in particular the modulus of elasticity) are not detrimentally affected either, with respect to the terpolymers alone.

DESCRIPTION OF EMBODIMENTS OF THE INVENTION

Figure 1:
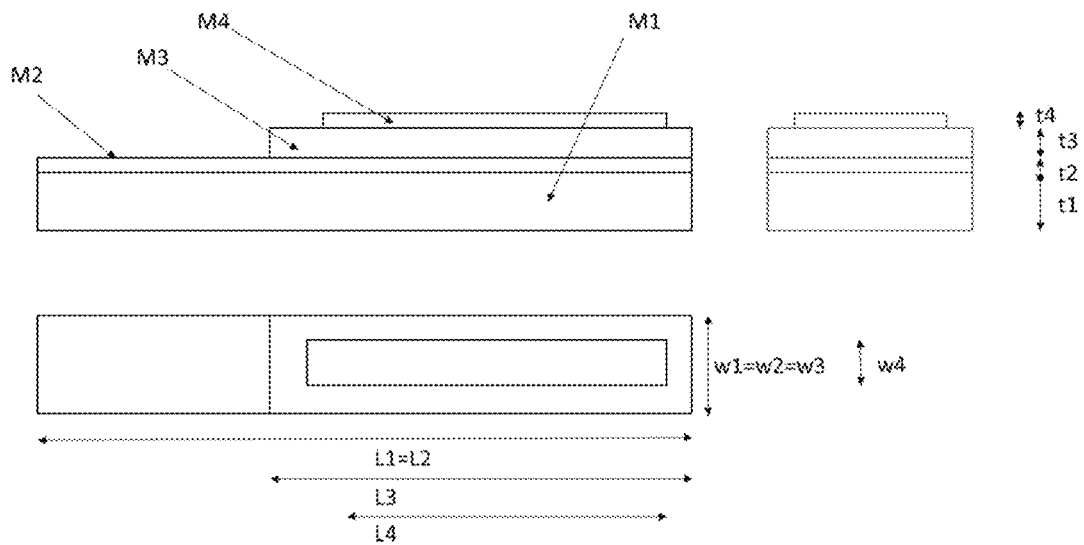
FIG. 1 is a schematic view of an actuator according to the invention, in which: M1 is a PET substrate, M2 is a bottom silver nanowires electrode, M3 is an electroactive polymer film, and M4 is a top gold electrode.

The invention is now described in detail.

The present invention describes materials and methods to design polymer-based actuators with improved actuator deformations and electromechanical energy in a wide range of temperature and frequency. A large operating condition range in frequency and temperature is indeed of high interest for applications such as automotive or consumer electronics. In these applications, devices are required to perform in temperatures ranges from −20° C. to +130° C. and from 0 to 1 MHz and preferably from 0 to 20 kHz. Fluorinated electroactive polymers have usually glass transition temperatures below −10° C. and Curie transition temperature in the 20° C. to 140° C. temperature range. Therefore mechanical and electromechanical properties exhibit large variation upon temperature. In particular, elastic modulus of these fluorinated electroactive terpolymers decreases as temperature increases. It results in bad electroactive properties at high temperatures.

The invention provides new materials combining an electroactive fluoro-terpolymer and an electroactive copolymer compatible with the terpolymer. This particular combination allows to maintain the mechanical properties of the terpolymer while enhancing its electromechanical properties on a large range of temperature.

The invention is based on the use of an electroactive fluoro-terpolymer. The term "fluoro" is understood to mean a terpolymer comprising —F groups. The term "electroactive" is understood to mean a terpolymer capable of being strained under the effect of an electric field. Preferably, the fluoro-terpolymer is a relaxor ferroelectric polymer. Compared to standard ferroelectric materials, relaxor ferroelectrics exhibit a maximum of dielectric constant with temperature that varies with frequency. Such a material usually exhibits a weak coercive field (typically of less than 10 V/$\mu$m) and a weak (typically of less than 10 mC/m$^2$), indeed even zero, remnant polarization.

The electroactive terpolymer has the formula P(VDF-TrFE-X) and comprises monomer units of vinylidene fluoride, of trifluoroethylene and of a third monomer X, X being 1-chloro-1-fluoroethylene (CFE) or chlorotrifluoroethylene (CTFE). The molar proportion of X units in the terpolymer is inferior to 8%, preferably inferior or equal to 7% and more preferably inferior or equal to 5%. The molar ratio VDF/(VDF+TrFE) is in the range of 15 to 60%, preferably in the range of 30 to 55%.

This terpolymer is mixed with an electroactive copolymer of formula P(VDF-TrFE) comprising monomer units of vinylidene fluoride and of trifluoroethylene. The molar proportion of TrFE units in the copolymer is superior to 40%, preferably superior or equal to 45%. Thus, the copolymer exhibits an electroactive behavior and this, in an unmodified form, i.e. without undergoing modifications such as irradiation or stretching.

According to one embodiment, the composition consists of P(VDF-TrFE-TFE) and P(VDF-TrFE).

According to one embodiment, the composition consists of P(VDF-TrFE-CTFE) and P(VDF-TrFE).

The weight proportion of electroactive terpolymer in the composition is superior to 50%, preferably superior to 70%, more preferably superior or equal to 80%.

The terpolymers of the invention can be produced by using any known process, such as emulsion polymerization, suspension polymerization and solution polymerization. The use of the process described in the document WO 2010/116105 is particularly preferred. This process makes it possible to obtain polymers of high molecular weight and of appropriate structuring.

The molar composition of the terpolymers of the invention can be determined by various means. The conventional methods for elemental analysis of carbon, fluorine and chlorine or bromine elements result in a system of two or three independent equations having two independent unknowns (for example % VDF and % TrFE, with % X=100−(% VDF+% TrFE)), which makes it possible to unambiguously calculate the composition by weight of the polymers, from which the molar composition is deduced.

Use may also be made of multinuclear, in this instance proton ($^1H$) and fluorine ($^{19}F$), NMR techniques, by analysis of a solution of the polymer in an appropriate deuterated solvent. The NMR spectrum is recorded on an FT-NMR spectrometer fitted with a multinuclear probe. The specific signals given by the different monomers in the spectra produced according to one or other nucleus are then located. Thus, for example, the TrFE (CFH=$CF_2$) unit gives, in proton NMR, a specific signal characteristic of the CFH group (at approximately 5 ppm). It is the same for the $CH_2$ groups of the VDF (broad unresolved peak centred at 3 ppm). The relative integration of the two signals gives the relative abundance of the two monomers, that is to say the VDF/TrFE molar ratio.

The combination of the relative integrations of the different signals obtained in proton NMR and in fluorine NMR results in a system of equations, the resolution of which results in the molar concentrations of the different monomer units being obtained.

Finally, it is possible to combine the elemental analysis, for example for the heteroatoms, such as chlorine or bromine, and the NMR analysis. Thus, the content of CTFE or of CFE can be determined by a measurement of the chlorine content by elemental analysis.

A person skilled in the art thus has available a palette of methods or of combinations of methods allowing him to determine, without ambiguity and with the necessary accuracy, the composition of the terpolymers of the invention.

The invention is based on the blending of the above terpolymer with an electroactive copolymer of formula P(VDF-TrFE), compatible with the terpolymer and exhibiting a glass transition temperature lower than that of the terpolymer. The term "compatible" is understood to mean that the mixture of the two polymers forms a homogeneous phase with a single glass transition temperature. The glass transition temperature of the polymers of the invention can be measured by differential scanning calorimetry, for example according to the standard ASTM E1356.

The copolymers of the invention can be produced by using any known process, such as emulsion polymerization, suspension polymerization and solution polymerization. The use of the process described in the document WO16/055712 without termonomer introduction, is particularly preferred.

According to a second aspect, the invention concerns a liquid formulation of electroactive fluoropolymers comprising the composition described above, in solution in a solvent. According to one embodiment, the solvent is selected from the group of ketones, such as dimethylformamide, dimethyl acetamide, dimethyl sulfoxide, ketones solvents such as acetone, methyl ethyl ketone, methyl isobutyl ketone, cyclohexanone and cyclopentanone, furans such as tetrahydrofuran; esters such as methyl acetate, ethyl acetate, propyl acetate, butyl acetate, glycol ethers and glycol ether esters such as propylene glycol methyl ether acetate; carbonates such as dimethylcarbonate; phosphates such as triethylphosphate, dimethylsulfoxide; or their mixtures. Preferably, the solvent is selected from low toxic solvents such as ketones solvents such as acetone, methyl ethyl ketone, methyl isobutyl ketone, cyclohexanone and cyclopentanone; esters such as methyl acetate, ethyl acetate, propyl acetate, butyl acetate, glycol ethers and glycol ether esters such as propylene glycol methyl ether acetate; carbonates such as dimethylcarbonate; phosphates such as triethylphosphate; or their mixtures. The liquid formulation may comprise an additive selected from the group of: wetting agents, viscosity modifiers, adhesion modifiers and crosslinking agents.

In the liquid formulation of the invention, the solvent can preferably be present in a proportion by weight of at least 50%, preferably of at least 80%, more particularly preferably of at least 95%, indeed even of at least 99%.

The invention also provides films manufactured from formulations according to the invention and deposited on a substrate. The substrate can, for example, be a polymeric substrate, such as a poly(ethylene terephthalate) or polyethylene naphthalate substrate, or else a substrate of paper, of glass or of silicon.

Preferably, the film is deposited by the solvent or molten route, then dried and annealed in order to crystallize it (by heating at a temperature lower than the melting point of the composition, for a period of time of greater than or equal to 1 minute).

Advantageously, the film is in an unstretched state.

This film exhibit elastic modulus at room temperature above 100 MPa, and preferably above 500 MPa, and more preferably above 800 MPa. This film exhibit high electromechanical performances with deformation upon an applied field of 110 V/μm above 0.1% and preferably above 1% and preferably above 1.5%.

The invention also provides multilayer structures, comprising at least one film with the formulation of the invention and electrodes on either side. Such structures can in particular be produced:

by coating the liquid formulation on a substrate, evaporation of the solvent, annealing and deposition of electrodes by evaporation or sputtering of metal deposit, indium tin oxide, deposition of a layer of conductive polymer, deposition of a conductive layer starting from conductive inks based on silver, silver nanowires, copper, or graphene, and the like; or else by solvent casting processes, such as printing technologies (printing the liquid formulation on a substrate, for example by screen printing, spin coating, slot die, ink jet, aerosol jet, photogravure, offset printing, and the like, and then annealing and deposition of electrodes by evaporation or sputtering of metal deposit, indium tin oxide, deposition of a layer of conductive polymer, deposition of a conductive layer starting from conductive inks based on silver, silver nanowires, and the like.

These multilayer structures can thus provide actuators with improved performances compared to actuators based on terpolymers alone: improved electromechanical energies over a wide range of temperature, improved mechanical properties, large operating frequency range from 0 to 1 MHz, preferably from 0 to 20 kHz.

Other devices which can be produced, comprising at least one layer of the film according to the invention, are electromechanical devices, acoustic devices such as loudspeakers or ultrasound transducers, microelectromechanical systems (MEMS), sensors, electrocaloric devices and (opto) electronic devices.

EXAMPLES

The following examples illustrate the invention without limiting it.

Polymer synthesis Fluorinated terpolymers P(VDF-TrFE-CFE) and P(VDF-TrFE-CTFE) of different compositions have been synthesized and characterized using the method described in WO 2010/116105.

Fluorinated copolymers P(VDF-TrFE) of different compositions have been synthesized and characterized using the method described in WO16/055712 without termonomer introduction.

Compositions have been measured by NMR.

Solution and Film Preparation

Ten weight percent of polymer or polymer mix were dissolved in 90 weight percent of methyl isobutyl ketone (MIBK) for 2 hours at 70° C. and the solution was filtered with a PTFE filter with 5.0 μm-sized pores. The solution was then kept at room temperature for 24 hours to remove the bubble inside the solution. Finally, the mixture was cast onto the glass with applicator, 200 micrometer gap, and the film began to form. The film was annealed in the vacuum dry oven at 85° C. for two hours to remove remaining solvent and 115° C. for six hours to increase crystallinity. The thickness of all prepared films was 3.6 micrometer.

Actuator Manufacturing and Characterization

In order to evaluate electromechanical properties of the different materials, the film is laminated on a polyethyleneterephtalate 130 μm thick film coated with silver-nanowires as bottom electrode. 15 nm gold is then sputtered on the top of the polymer (top electrode). The final form of the device is cut by laser.

The actuator has the characteristics given in FIG. 1, i.e.:
PET substrate, dimensions: t1*w1*L1: 130 μm*9 mm*77 mm
Bottom silver nanowires electrode, dimensions: t2*w2*L2: 0.1 pm×9 mm*77 mm
Electroactive polymer film, dimensions t3*w3*L3=3.6 μm*9 mm*52 mm
Top gold electrode, dimensions: t4×w4*L4=15 nm×5 mm*45 mm.

One end of the actuator is clamped on a fixed support. Top and bottom electrodes are connected to a tension generator.

A sinusoidal voltage (amplitude 110 MV/m, frequency 0.1 hz) is applied between the two electrodes.

Figure 2:
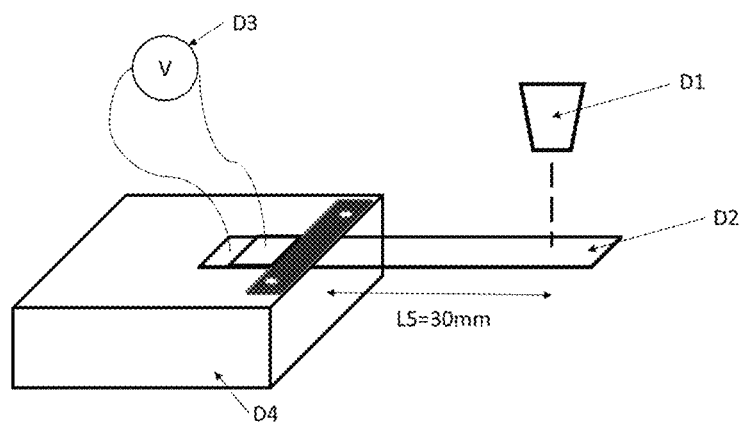
FIG. 2 is a schematic view of measurement set-up, in which D1 is a laser deformation sensor, D2 is an actuator, D3 is a voltage generator and D4 is a support.

FIG. 2 describes the experimental set-up in which D1 is a laser deformation sensor, D2 is an actuator, D3 is a voltage generator and D4 is a support.

Actuator deflection (D) is measured at a distance L5 from the support D4 by using the Laser Displacement Sensor (LDS) LT-9010 D1.

For measurement in different temperature conditions, experimental set-up is placed in a thermal chamber with controlled temperature. Sample is kept 10 minutes after temperature stabilization before experimental measurements.

The strain $\varepsilon_3$ of the electroactive polymer layer can be calculated using the composite beam theory (according to Ju, W. E., Moon, Y. J., Park, C. H., & Choi, S. T. (2014). "A flexible tactile-feedback touch screen using transparent ferroelectric polymer film vibrators." *Smart Materials and Structures*, 23(7), 074004):

$$\varepsilon_3 = \frac{2D(YI)_{eff}}{L_5^2 y_3 t_3 w_4 (\eta_3 - \eta)} \quad (1)$$

wherein:
ε3 is the electroactive polymer layer longitudinal strain under electric field E;
w4 is the width of the electroactive film layer covered by the upper electrode;
$Y_3$ is the Young modulus of the fluorinated polymer layer;
t3 is the thickness of the fluorinated polymer layer.

The position of neutral axis (η) of the composite structure and the position of the neutral axis of the $i^{th}$ layer $(\eta_i)$ layer are calculated as follows:

$$\eta_i = \sum_{k=1}^{i} t_k - \frac{t_i}{2}; \eta = \frac{\sum_{i=1}^{4} Y_i t_i w_i \eta_i}{\sum_{j=1}^{4} Y_j w_j t_j} \quad (2)$$

The effective flexural modulus per unit length of the beam, $(YI)_{eff}$, is calculated using the equation (3) below:

$$(YI)_{eff} = \sum_{i=1}^{4} Y_i t_i w_i \left[ \frac{t_i^2}{12} + (\eta_i - \eta)^2 \right]. \quad (3)$$

On the other hand, the elastic energy density (U) of the electroactive polymer layer can be calculated in terms of the longitudinal strain ε3 of the electroactive polymer layer by using the equation (4) below:

$$U = \frac{1}{2} Y_3 \varepsilon_3^2 \quad (4).$$

For each sample under an applied voltage V, maximum deflection is measured (Dm(V)). From Dm(V), geometrical and mechanical characteristics of each electroactive polymer layer can then be estimated by the elastic energy density of the electroactive polymer layer (Um(V)).

Mechanical properties of the different materials are as follows:
Gold (upper electrode): 81 GPa (Merle, B. (2013). "Mechanical properties of thin films studied by bulge testing", Erlanger, Fau University Press 12)
Silver nanowire (bottom electrode): 10 GPa ("Size effects on elasticity, yielding and fracture of silver nanowires: in situ experiments." Yong Zhu et al., Physical Review B 85, 2012.)

PET(Substrate): 2.4 GPa (according to Ju, W. E et al. cited above).

Elastic modulus of the different fluorinated polymer films have been measured at different temperatures using a dynamic mechanical analysis apparatus under a frequency of 1 Hz. Tables 1, 2 and 3 below show the compositions of the different fluorinated electroactive polymers used. Compositions are given in moles %.

TABLE 1

Table 1: P(VDF-TrFE-CFE) terpolymer compositions

| Reference | % VDF | % TrFE | % CFE |
|---|---|---|---|
| CFE1 | 71.2 | 25 | 3.8 |
| CFE2 | 44.5 | 47.8 | 7.7 |
| CFE3 | 50.6 | 35.6 | 13.8 |

TABLE 2

Table 2: P(VIDF-TrFE-CTFE) terpolymer compositions

| Reference | % VDF | % TrFE | % CTFE |
|---|---|---|---|
| CTFE1 | 61.4 | 34.4 | 4.2 |
| CTFE2 | 67.1 | 21.5 | 11.4 |
| CTFE3 | 52.3 | 35 | 12.7 |

TABLE 3

Table 3: P(VDF-TrFE) copolymer compositions

| Reference | % VDF | % TrFE |
|---|---|---|
| TrFE 45 | 55 | 45 |
| TrFE 25 | 75 | 25 |

Table 4 shows elastic Young modulus (in MPa) of the different electroactive polymers and combinations of polymers at 25° C. and 60° C.

TABLE 4

| | 25° C. | 60° C. |
|---|---|---|
| CFE1 | 570 | 240 |
| CFE2 | 240 | 80 |
| CFE3 | 110 | 45 |
| CTFE1 | 470 | 160 |
| CTFE2 | 140 | 60 |
| CTFE3 | 120 | 50 |
| TrFE 25 | 1500 | 1000 |
| TrFE 45 | 1500 | 1000 |

Table 5 shows maximum deflection values, Dm(V), in μm measured at 25° C. under an electric field of amplitude 110 V/μm for different actuators based on electroactive fluorinated polymers and combinations of electroactive polymers. These results show that the performances under ambient conditions of actuators are improved with terpolymers having low termonomer content. Combination of an electroactive terpolymer with an electroactive copolymer having high TrFE content improves actuator's performances under ambient temperature conditions. Combination of an electroactive terpolymer with an electroactive copolymer having low content of TrFE decreases the actuator's performances under ambient temperature conditions.

TABLE 5

| | 0% Weight Copolymer | 10% TrFE 45 | 20% TrFE 45 | 10% TrFE 25 | 20% TrFE 25 |
|---|---|---|---|---|---|
| CFE1 | 405 | 430 | 472 | 395 | 335 |
| CFE2 | 371 | 427 | 455 | 353 | 276 |
| CFE3 | 213 | 257 | 308 | 199 | 186 |
| CTFE1 | 408 | 497 | 453 | 412 | 370 |
| CTFE2 | 272 | 306 | 315 | 218 | 194 |
| CTFE3 | 244 | 294 | 325 | 173 | 169 |

Table 6 shows elastic energy density Um(V) (in Joules/cm$^3$) for the different actuators at 25° C. under an electric field of 110 V/μm. These results show that performances under ambient conditions of actuators are improved with terpolymers having low termonomer content. Mixing an electroactive terpolymer with an electroactive copolymer having high TrFE content improves actuator's performances under ambient temperature conditions. Combination of an electroactive terpolymer with an electroactive copolymer having low content of TrFE decrease actuator's performances under ambient temperature conditions.

TABLE 6

| | 0% Weight Copolymer | 10% TrFE 45 | 20% TrFE 45 | 10% TrFE 25 | 20% TrFE 25 |
|---|---|---|---|---|---|
| CFE1 | 0.0084 | 0.0083 | 0.0088 | 0.0070 | 0.0044 |
| CFE2 | 0.0163 | 0.0143 | 0.0123 | 0.0098 | 0.0045 |
| CFE3 | 0.0116 | 0.0076 | 0.0071 | 0.0045 | 0.0026 |
| CTFE1 | 0.0103 | 0.0127 | 0.0090 | 0.0087 | 0.0060 |
| CTFE2 | 0.0149 | 0.0097 | 0.0070 | 0.0049 | 0.0026 |
| CTFE3 | 0.0140 | 0.0096 | 0.0077 | 0.0033 | 0.0021 |

Table 7 shows maximum deflection values, Dm(V), in μm measured at 25° C. and 60° C. under an electric field of amplitude 110 V/μm for different actuators based on electroactive fluorinated polymers and combinations of electroactive polymers.

TABLE 7

| | 0% Wt. Copolymer | | 10% TrFE 45 | | 20% TrFE 45 | |
|---|---|---|---|---|---|---|
| | 25° C. | 60° C. | 25° C. | 60° C. | 25° C. | 60° C. |
| CFE1 | 405 | 310.2 | 430 | 349 | 472 | 402.5 |
| CFE2 | 371 | 149.6 | 427 | 169.4 | 455 | 222.8 |
| CFE3 | 213 | 60.2 | 257 | 83 | 308 | 96.2 |
| CTFE1 | 408 | 214.8 | 497 | 211.8 | 453 | 214 |
| CTFE2 | 272 | 111.4 | 306 | 142.4 | 315 | 193 |
| CTFE3 | 244 | 108.4 | 294 | 110.4 | 325 | 134.6 |

These results show that performances of actuators made with electroactive terpolymers with low termonomer contents are improved compared to actuators made with terpolymer with high termonomer content at ambient and high temperature. Blends of terpolymers with copolymer having high TrFE content improves actuator's performances at high temperature.

Table 8 shows elastic energy density Um(V) (in Joules/cm$^3$) for different actuators at 25° C. and 60° C. under an electric field of 110 V/μm. These results show that performances of actuators made with electroactive terpolymers with low termonomer content are improved compared to actuators made with terpolymers with high termonomer content, both at ambient and high temperature. Blends of a terpolymer with a copolymer having high TrFE content improves actuator's performances at high temperature.

TABLE 8

|  | 0% Weight Copolymer | | 10% TRFE 45 | | 20% TrFE 45 | |
| --- | --- | --- | --- | --- | --- | --- |
|  | 25° C. | 60° C. | 25° C. | 60° C. | 25° C. | 60° C. |
| CFE1 | 0.0084 | 0.0114 | 0.0083 | 0.0110 | 0.0088 | 0.0119 |
| CFE2 | 0.0163 | 0.0078 | 0.0143 | 0.0047 | 0.0123 | 0.0054 |
| CFE3 | 0.0116 | 0.0023 | 0.0076 | 0.0014 | 0.0071 | 0.0011 |
| CTFE1 | 0.0103 | 0.0081 | 0.0127 | 0.0052 | 0.0090 | 0.0040 |
| CTFE2 | 0.0149 | 0.0058 | 0.0097 | 0.0037 | 0.0070 | 0.0043 |
| CTFE3 | 0.0140 | 0.0066 | 0.0096 | 0.0024 | 0.0077 | 0.0021 |

The invention claimed is:

1. An electroactive fluoropolymer composition consisting of:
   a) an electroactive terpolymer of formula P (VDF-TrFE-X) comprising monomer units of vinylidene fluoride (VDF), of trifluoroethylene (TrFE) and of a third monomer X, X being 1-chloro-1-fluoroethylene (CFE), the molar proportion of X units in the terpolymer being inferior or equal to 3.8%, and
   b) an electroactive copolymer of formula P (VDF-TrFE) comprising monomer units of vinylidene fluoride and of trifluoroethylene, the molar proportion of TrFE units in the copolymer being at least 45%.

2. The composition of claim 1, in which the electroactive terpolymer has a molar ratio VDF/(VDF+TrFE) in the range of 15 to 60%.

3. The composition of claim 1, wherein the mass ratio of electroactive terpolymer in the composition is superior to 50%.

4. A liquid formulation of electroactive fluoropolymers comprising the composition according to claim 1, in a solvent.

5. The formulation of claim 4 in which said solvent is selected from the group of ketones, dimethylformamide, dimethyl acetamide, dimethyl sulfoxide, acetone, methyl ethyl ketone, methyl isobutyl ketone, cyclohexanone and cyclopentanone, furans, tetrahydrofuran; esters, methyl acetate, ethyl acetate, propyl acetate, butyl acetate, glycol ethers and glycol ether esters, propylene glycol methyl ether acetate; carbonates, dimethylcarbonate; phosphates, triethylphosphate, dimethylsulfoxide; or their mixtures.

6. The formulation of claim 4 also comprising an additive selected from the group of: wetting agents, viscosity modifiers, adhesion modifiers and crosslinking agents.

7. Film obtained from the formulation of claim 4.

8. Film according to claim 7, having elastic modulus at room temperature above 500 MPa, wherein the film is in an unstretched state.

9. Film according to claim 7, wherein said film presents a deformation, upon an applied field of 110 V/μm, above 0.1%.

10. Film according to claim 7, prepared by a solvent cast process.

11. An electromechanical device comprising at least one layer of the film according to claim 7.

12. An actuator comprising at least one layer of the film according to claim 7.

13. An acoustic device, said acoustic device comprising at least one layer of the film according to claim 7.

14. A microelectromechanical system (MEMS) comprising at least one layer of the film according to claim 7.

15. An (opto)electronic device comprising at least one layer of the film according to claim 7.

* * * * *